United States Patent [19]

Clark

[11] Patent Number: 4,936,175
[45] Date of Patent: Jun. 26, 1990

[54] PRINTING PLATE REGISTERING METHOD AND DEVICE

[76] Inventor: Alfred L. Clark, P.O. Box 34, Zionsville, Ind. 46077

[21] Appl. No.: 253,266

[22] Filed: Oct. 4, 1988

[51] Int. Cl.[5] .................................. B26D 7/00
[52] U.S. Cl. ........................ 83/467.1; 101/DIG. 36; 83/29; 83/55; 83/618; 83/620
[58] Field of Search ................ 83/29, 55, 467 A, 618, 83/620; 29/464, 467, 468; 101/DIG. 36, 216

[56] References Cited

U.S. PATENT DOCUMENTS

| | | |
|---|---|---|
| 2,600,809 | 6/1952 | Simmons . |
| 4,016,577 | 4/1977 | Hensy et al. . |
| 4,095,893 | 6/1978 | Handsman ............................ 355/74 |
| 4,155,644 | 5/1979 | Hess ..................................... 355/72 |
| 4,735,122 | 4/1988 | Chabot ............................ 83/467 A |
| 4,776,822 | 10/1988 | Dougherty ............................ 29/464 |

OTHER PUBLICATIONS

Brochure for the Carlson Small Press Punches Distributed by the Chesley F. Carlson Company of Minnesota (Undated).
Brochure for Protocol Register Systems and Equipment Distributed by Protocol Engineering PLC of England (Publication No. P60(587)Eng.) 1987.
Paper Showing the Stroesser Small Press Register System Distributed by Stroesser Register Systems of California (Undated), 2 sheets.

*Primary Examiner*—Robert P. Olszewski
*Assistant Examiner*—Jack W. Lavinder
*Attorney, Agent, or Firm*—Woodard, Emhardt, Naughton, Moriarty & McNett

[57] ABSTRACT

A printing plate registering method and device having a substantially flat working surface. A punch is provided for punching holes through printing plates and through masking flats located on the working surface. A pair of pin members is provided extending above the working surface and insertable in holes located in a lateral row along one edge of the printing plate. The pin members impart a lateral tension along the row of holes, causing the printing plate to be registered with respect to the pin members and with respect to the working surface. The pin members tangentially nest in the laterally outermost tangent point of such pre-punched register holes, causing precise lateral and longitudinal registering. Selectable pairs of pin members are provided to allow for centering of the printing plate on the easel body. Pairs of such pin members are extendable or retractable upon rotation of a shaft having cam grooves therein. The pin members are spring-biased outwardly to impart such laterally outward tension to the printing plate.

22 Claims, 9 Drawing Sheets

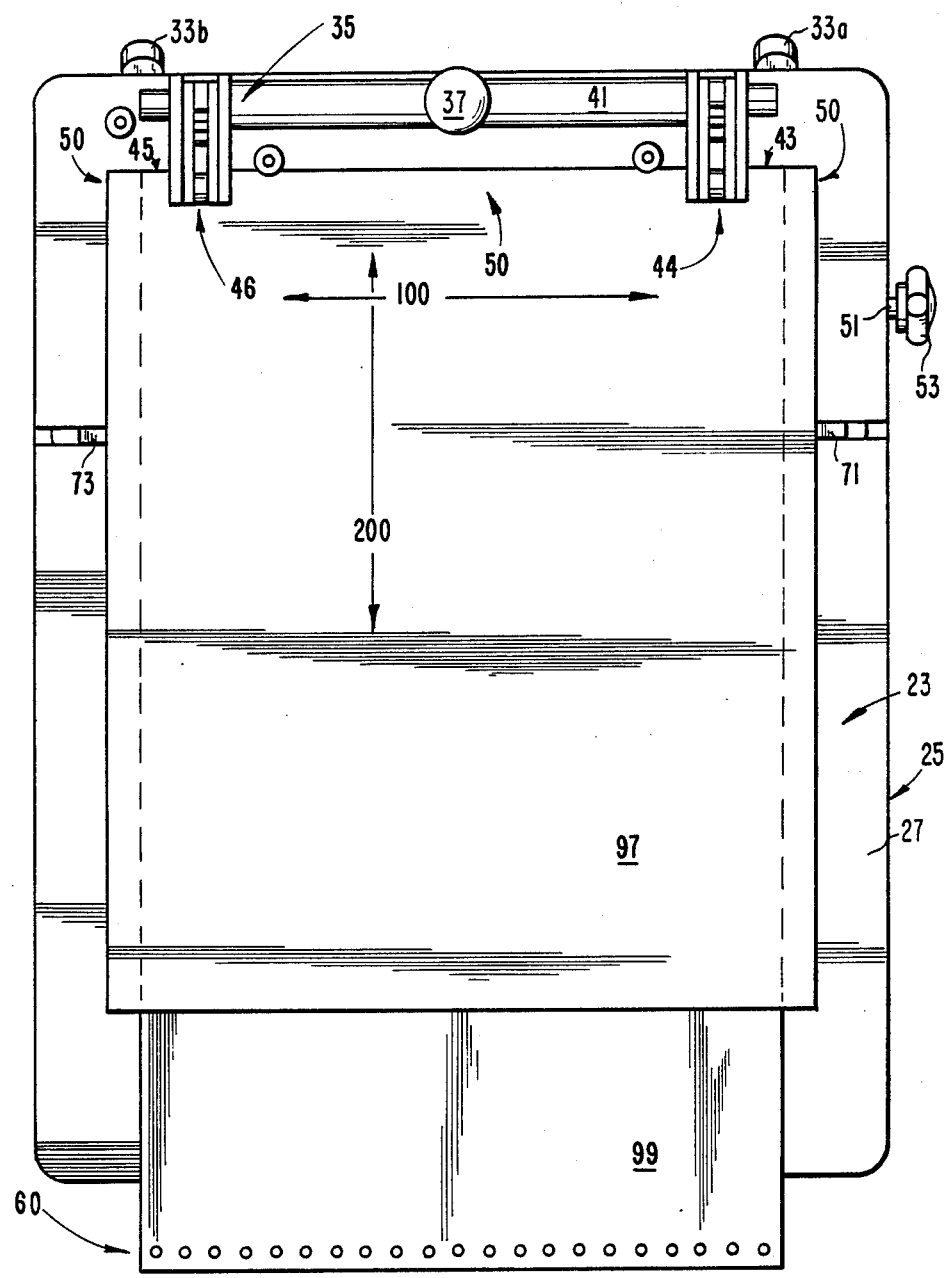

PRINTING PLATE REGISTERING METHOD AND DEVICE

BACKGROUND OF THE INVENTION

The present invention relates generally to printing and more specifically to a method and device for registering printing plates.

Drum mountable offset printing plates are widely used in the printing industry. Typically, such plates are flexible to be wrapped around the printing drum of an offset printing press. The plates are typically rectangular in shape, having one row of holes spaced laterally apart along one end of the printing plate and having another row of holes spaced laterally apart along the opposite end of the printing plate. The industry standard for such printing plates has the hole centers uniformly spaced laterally one half inch apart with a nominal hole diameter of 0.160 inches. When mounted on the printing drum, the holes are placed over pin bars and pulled in tension in a longitudinal, circumferential direction around the printing drum as is well-known. The printing plate has an image imposed thereon corresponding to the material to be printed, such as, for example, a wedding invitation. It is extremely important that this printing image be precisely located on the printing plate to avoid misalignment of the printed image on the printing paper.

To achieve this critical alignment, small press registering systems are used. Such systems are typically easels having paper punch type punches. The punches are used to punch holes through both the printing plate and the masking flat. The masking flat provides a negative having the image to be transposed onto the printing plate. Since the alignment of the image on the printing plate is critical, as discussed above, it is critical to locate the masking flat over the printing plate with precise alignment. Prior art registering systems provide alignment of the unpunched printing plate on the easel by using pins insertable through the 0.160 inch holes. Such pins are fixed with respect to the easel and hold the printing plate in position.

Although the industry standard nominal diameter for the laterally spaced holes is 0.160 inches, it has been observed that the true diameters of such holes vary significantly depending upon the manufacture. Thus, the true diameter of such 0.160 nominal diameter holes has been found to range between approximately 0.150 inches and 0.171 inches. Accordingly, with the pin registering systems heretofore used, an unacceptable degree of play existed between an oversized hole and a fixed registering pin. Such play allowed the printing plate to shift with respect to the easel, thereby reducing the precision with which alignment could be made. One way the prior art has attempted to address this problem is by providing modified registering pins. These modified registering pins have a stepped cross-section providing various cross-sectional diameters at various locations along the axial length of the pin. Thus, the pin provides various cross-sectional diameters to account for the variance in actual diameter of the registering holes. Also, frustoconical pins providing an infinite, rather than incremental, number of cross-sectional diameters have been used.

The present invention provides a significant advance over prior art approaches to this problem. It allows for a single pin size which accommodates the full range of actual hole diameters present in the industry. It furthermore provides for positive registering of the printing plate with respect to the easel in a predetermined location with a high degree of precision. Furthermore, the present invention provides a method and device with which a printing plate may be laterally centered on the easel depending on the lateral location of the row of registering holes with respect to the longitudinal edges of the printing plate.

The present invention achieves these advantageous results by providing a pair of pin members in two of the registering holes and imparting tension in the printing plate along the row of holes by exerting lateral force against the printing plate inside the holes. Accordingly, the present invention is a significant advance in the art.

SUMMARY OF THE INVENTION

According to one embodiment, the present invention provides a printing plate registering method comprising the steps of: providing a substantially flat working surface; locating a drum mountable offset printing plate on the working surface, the printing plate having a row of holes spaced apart laterally along one end of the printing plate; inserting a first pin member in a first of the holes; inserting a second pin member in a second of the holes; imparting tension in the printing plate along the row of holes between the first pin member and the second pin member with the first pin member exerting a first lateral force against the printing plate inside the first hole and with the second pin member exerting a second lateral force against the printing plate inside the second hole in an opposite direction to the first lateral force; aligning a masking flat over the printing plate; and punching at least one reference hole in the masking flat and in the printing plate.

The present invention also provides a device for registering drum mountable offset printing plates which have a row of registering holes laterally spaced apart along one end and arranged to register with a pin mount on the drum of an offset printing press, the row of holes including a first hole and a second hole spaced laterally apart, comprising: an easel body having a substantially flat working surface on a top side of the easel body; a first pin member attached to the easel body and extendable above the working surface, the first pin member sized smaller than the first hole and insertable therein; a second pin member attached to the easel body and extendable above the working surface, the second pin member sized smaller than the second hole and insertable therein; spring means associated with the second pin member for urging the second pin member laterally away from the first pin member, the second pin member having a relaxed mode and a biased mode, the biased mode occurring with the spring means imparting tension in the printing plate along the row of holes between the first pin member and the second pin member with the first pin member exerting a first lateral force against the printing plate inside the first hole and with the second pin member exerting a second lateral force against the printing plate inside the second hole in an opposite direction to the first lateral force; and punching means attached to the easel body for punching at least one reference hole in the printing plate and in a masking flat.

The present invention may also be characterized by a device for registering drum mountable offset printing plates which have a row of registering holes laterally spaced apart along one end and arranged to register with a pin mount on the drum of an offset printing press, the row of holes including a first hole and a second hole spaced laterally apart, comprising: an easel body having a substantially flat working surface on a top side of the easel body; a first pin member attached to the easel body and extendable above the working surface, the first pin member sized smaller than the first hole and insertable therein; a second pin member attached to the easel body and extendable above the working surface, the second pin member sized smaller than the second hole and insertable therein; a third pin member paired with and laterally spaced from the first pin member, the third pin member attached to the easel body and extendable above the working surface, the third pin member sized smaller than the first hole and insertable therein; a fourth pin member paired with and laterally spaced from the second pin member, the fourth pin member attached to the easel body and extendable above the working surface, the fourth pin member sized smaller than the second hole and insertable therein; cam means attached to the easel body for selectively extending and retracting pairs of the pin members for selectively locating the printing plate between a first lateral plate position and a second lateral plate position on the working surface, wherein the cam means has a first cam position having the first pin member and the second pin member extending above the working surface and spaced apart a first lateral distance, the first cam position further having the third pin member and the fourth pin member retracted below the working surface, and wherein the cam means has a second cam position having the third pin member and the fourth pin member extending above the working surface and spaced apart a second lateral distance greater than the first lateral distance, the second cam position further having the first pin member and the second pin member retracted below the working surface; and punching means attached to the easel body for punching at least one reference hole in the printing plate and in a masking flat.

An object of the present invention is to provide an improved printing plate registering method and device.

Related objects and advantages of the present invention are disclosed in the following description of the preferred embodiment.

BRIEF DESCRIPTION OF THE DRAWINGS

FIG. 1c is a top plan view of the present invention with a printing plate and a masking flat located thereon;

FIG. 2 is a side elevation view of the device of FIG. 1a;

FIG. 5 is a bottom plan view of the device of FIG. 1a;

DESCRIPTION OF THE PREFERRED EMBODIMENT

Figure 1A:
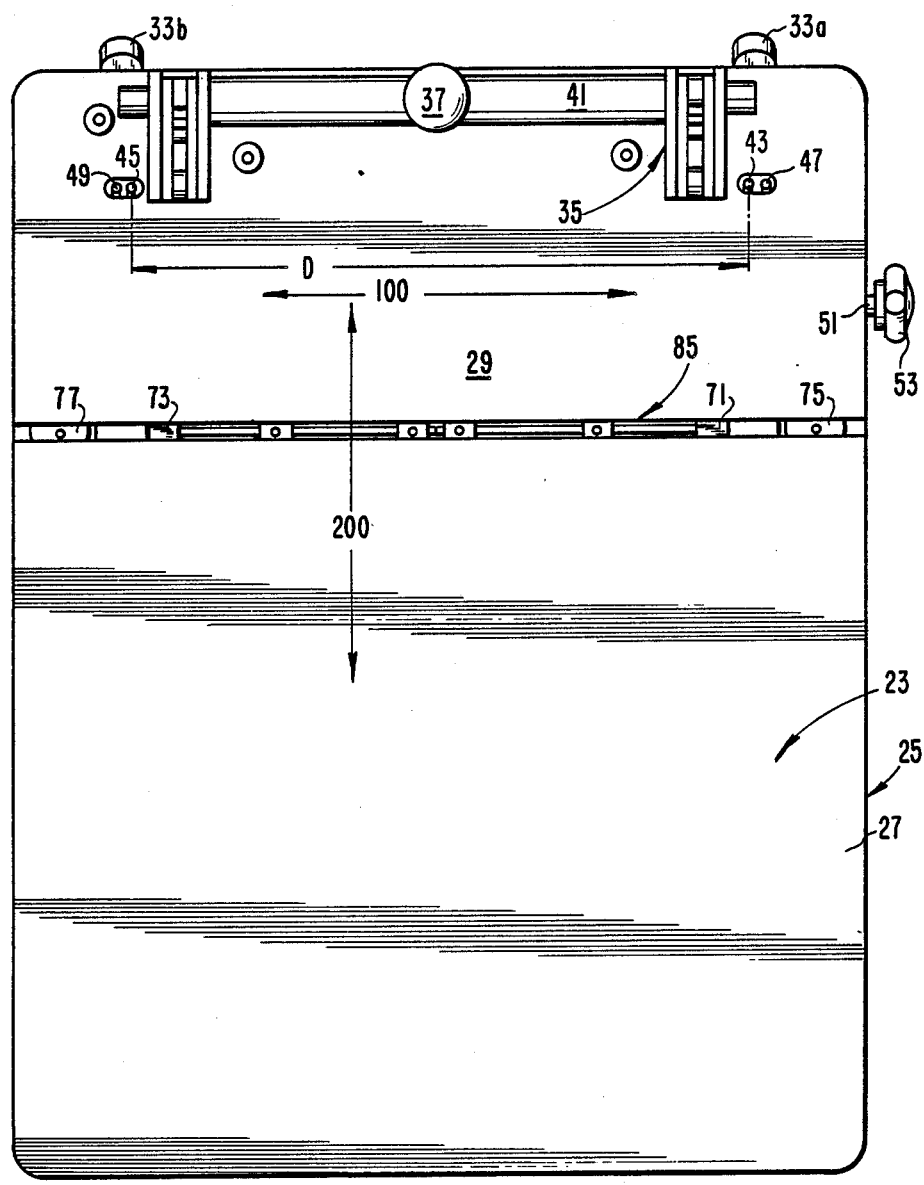
FIG. 1a is a top plan view of the device of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated method and device, and such further applications of the principles of the invention as illustrated therein being contemplated as would normally occur to one skilled in the art to which the invention relates.

Referring to FIGS. 1-10, a device 21 for registering drum mountable offset printing plates is shown. Easel body 23 includes base 25 which may be provided with a covering 27. Base 25 may be made of wood with covering 27 being selected from a variety of materials, such as linoleum. On the top side of easel body 23, working surface 29 is provided. Working surface 29 is substantially flat, and in the illustrated embodiment defines the top surface of covering 27. Base 25 may have rubber feet, such as rubber feet 31a, 31b, 31c, and 31d attached thereto. Furthermore, angled rubber foot 33a and angled rubber foot 33b may be attached to base 25 for use of easel body 23 in an inclined mode.

Figure 2:
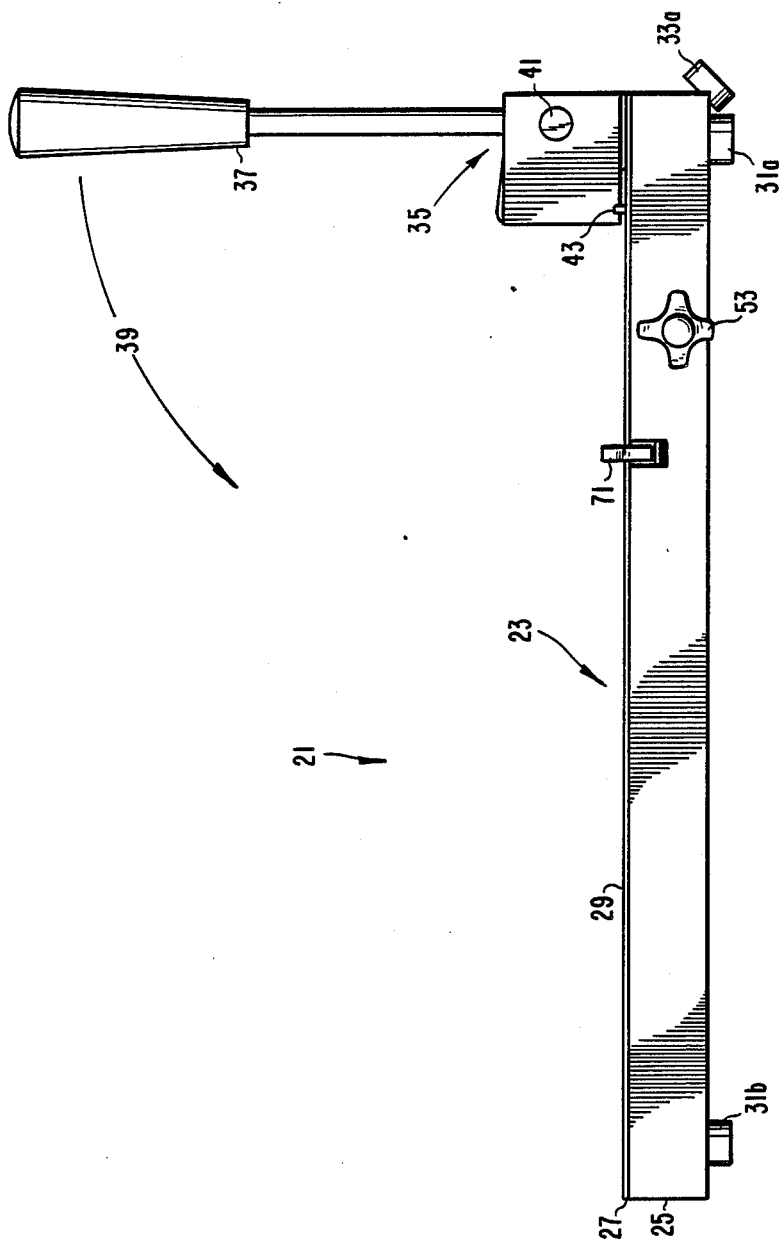
Figure 3:
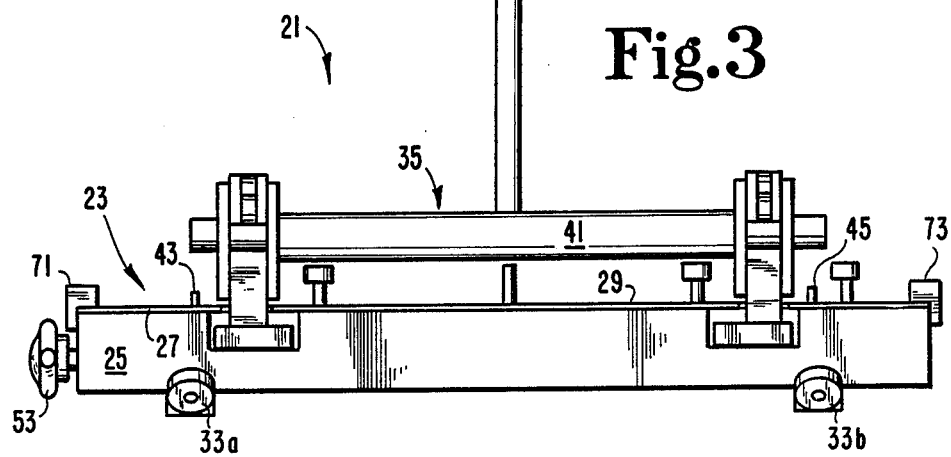
FIG. 3 is a front elevation view of the device of the present invention shown with a first pin member and a second pin member in a first position.
Figure 4:
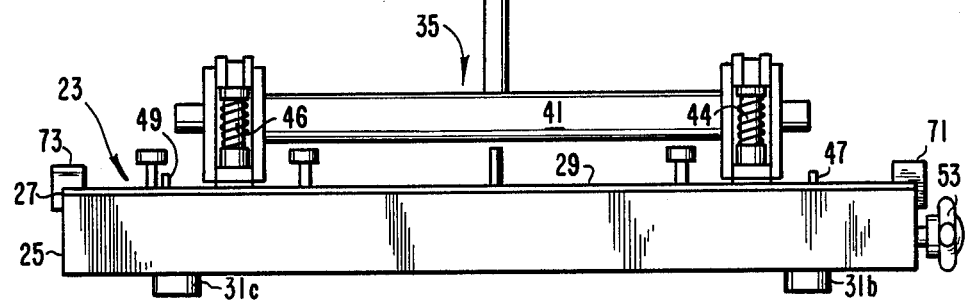
FIG. 4 is a rear elevation view of the device of the present invention with a third pin member and a fourth pin member in a second position.

Easel 23 has a punch 35 which is known in the art. Punch 35 includes handle lever 37 which, when pulled downwardly in direction 39 (see FIG. 2) causes a punching action, such as with a paper punch. Lever 37 is pulled in direction 39 causing pivot bar 41 to rotate. Rotation of pivot bar 41 in turn actuates hole punch 44 and hole punch 46 downwardly in a direction normal to working surface 29. Hole punch 44 and hole punch 46 (see FIG. 4) are spring-biased upwardly so they move reciprocally in a direction normal to working surface 29, returning handle 37 to its ordinary upright position as illustrated in FIGS. 2-4. Thus, punch 35 is typical of those found in the art.

The present invention provides at least two pin members, and in the preferred embodiment four pin members, used to register a printing plate with respect to easel body 23. Specifically, the present invention includes pin member 43, pin member 45, pin member 47, and pin member 49. Preferably, pin members 43, 45, 47 and 49 comprise metal rods, such as brass rods.

Figure 6:
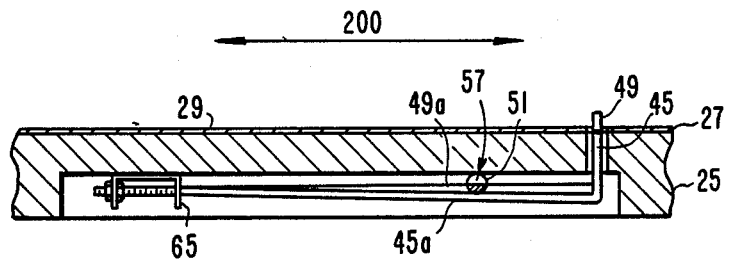
FIG. 6 is a partially cutaway side elevational detail of the device of FIG. 4.
Figure 7:
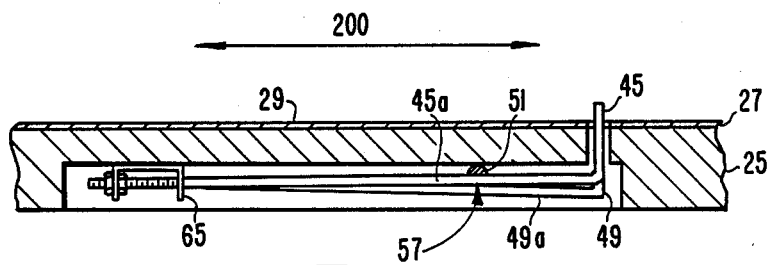
FIG. 7 is a partially cutaway side elevational detail of the device of FIG. 3.
Figure 8:
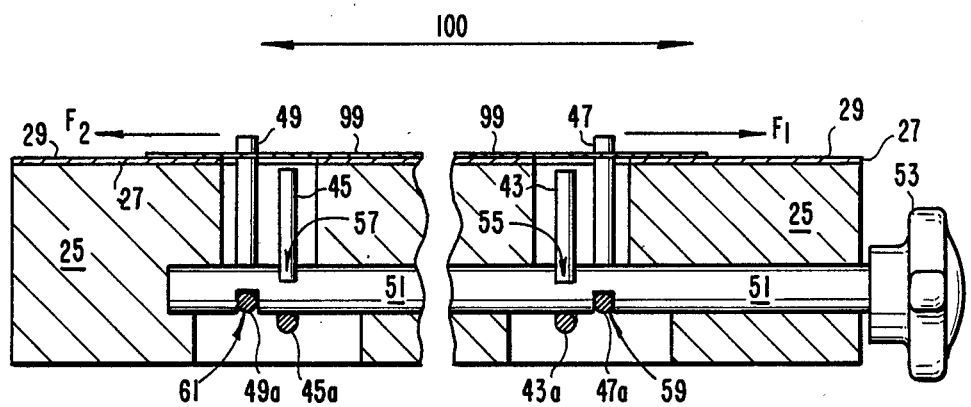
FIG. 8 is a partially cutaway rear elevational detail of the device of FIG. 4 with a printing plate thereon.

As shown in FIG. 1a, pin member 45 and pin member 49 are paired together near the left edge of easel body 23. Similarly, pin member 43 and pin member 47 are paired together near the right side of easel body 23. By comparing FIG. 3 with FIG. 4, it is shown how two out of the four pin members project above working surface 29 at a time. FIG. 3 illustrates pin member 43 and pin member 45 being extended above working surface 29. FIG. 4 shows pin member 47 and pin member 49 being extended above working surface 29. The mechanism for achieving the selectability of two out of the four pin members may be accomplished a variety of ways. In the preferred embodiment, lateral shaft 51 is provided, being disposed in base 25 and having knob 53 attached thereto. Shaft 51 is rotatable within a bore in base 25 upon turning of knob 53. Shaft 51 includes four circumferential grooves therein to act as cams for selectively extending and retracting the various pin members 43, 45, 47 and 49. More specifically, cam groove 55, cam groove 57, cam groove 59, and cam groove 61 are located in lateral shaft 51. As shown in FIGS. 6–8, rotation of shaft 51 by 180° causes pin member 47 and pin member 49 to be retracted below working surface 29 while causing pin member 43 and pin member 45 to project from below and extend upwardly above working surface 29. As described further below, pin members 43, 45, 47, and 49 are spring-biased upwardly to project above working surface 29. However, the presence of shaft 51 selectively impedes two out of the four pin members from projecting above working surface 29 while allowing each of the other two pins to nest into its corresponding cam groove to occupy a position extending above working surface 29. Reciprocating, rather than rotary, cams may be employed as an alternative.

The purpose for such selectability of pins is to allow the present invention to accomodate various locations of rows of pre-punched registering holes in a printing plate. More specifically, printing plate stock typically comes cut in a longitudinal direction with the pre-punched registering holes in a row perpendicular thereto and either a given distance from the edge or said given distance plus one quarter inch out of phase. Thus, the present invention's selectability of pins allows the operator to select the correct pin width to account for this different phased spacing in the printing plate so the printing plate may be centered on easel body 23 relative to hole punches 44 and 46. Accordingly, the laterally outer edge of pin member 43 is spaced about a quarter inch laterally inward from the laterally outer edge of pin member 45. Similarly, the laterally outer edge of pin member 45 is spaced about one quarter inch from the laterally outer edge of pin member 49. Due to the one half inch spacings between pre-punched registering holes, this quarter inch spacing allows for proper centering of the printing plate.

By comparing FIG. 6 and FIG. 7, it is shown how in a first position (FIG. 7) pin member 45 projects above working surface 29. When shaft 51 is rotated 180° to a second position, with cam groove 57 facing upwardly rather than downwardly (FIG. 6), pin member 45 is caused to retract downwardly due to the camming action of lateral shaft 51, whereas pin member 49 projects upwardly above working surface 29. The upward spring bias of the respective pin members is, in the preferred embodiment, provided by a longitudinal segment of the pin member generally parallel to working surface 29. Thus, longitudinal segment 43a, longitudinal segment 45a, longitudinal segment 47a, and longitudinal segment 49a provide a vertical spring bias in the respective pin members, urging them upwardly extendable above working surface 29. Each of the respective pin members 43, 45, 47 and 49 have a second, vertical segment connected to the respective longitudinal segment which, as illustrated in the drawing figures, is generally normal to working surface 29. Shaft 51 is transversely positioned with respect to the longitudinal segments parallel to lateral direction 100 and is located between the longitudinal segments and working surface 29.

Figure 5:
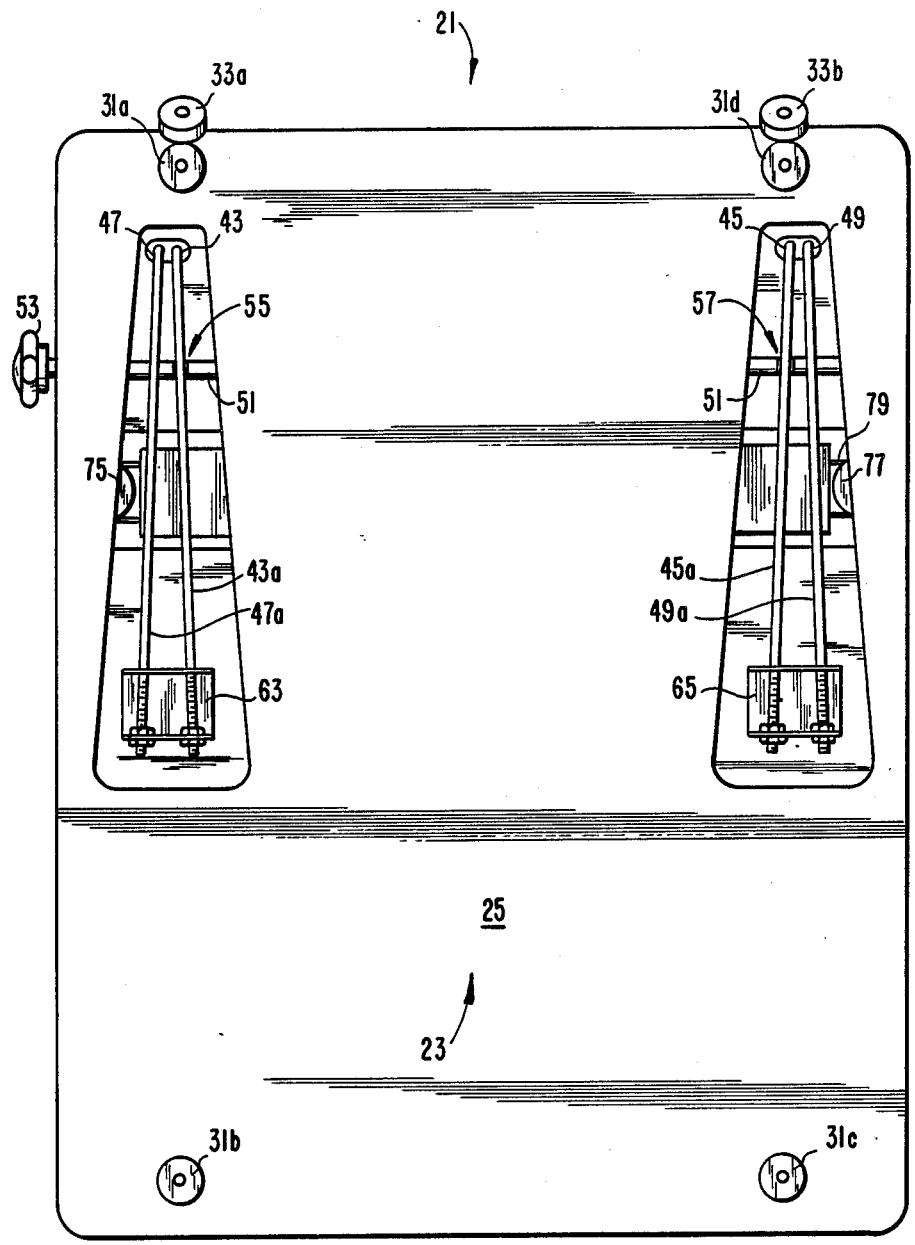

Longitudinal segments 43a, 45a, 47a, and 49a are attached to easel body 23 by either bracket 63 or bracket 65. As illustrated in FIGS. 5–7, the longitudinal segments 43a, 45a, 47a, and 49a are attached to the respective bracket 63 or 65 by threaded nuts. Other suitable attachment mechanisms may be utilized.

With regard to the present invention, a "lateral" direction is defined as the lateral direction 100 shown in the drawing figures corresponding to the alignment of pre-punched registering holes 50 having a 0.160 nominal diameter. Conversely, a "longitudinal" direction is shown as longitudinal direction 200, perpendicular to lateral direction 100. Both lateral direction 100 and longitudinal direction 200 are generally parallel to substantially flat working surface 29.

Figure 1B:
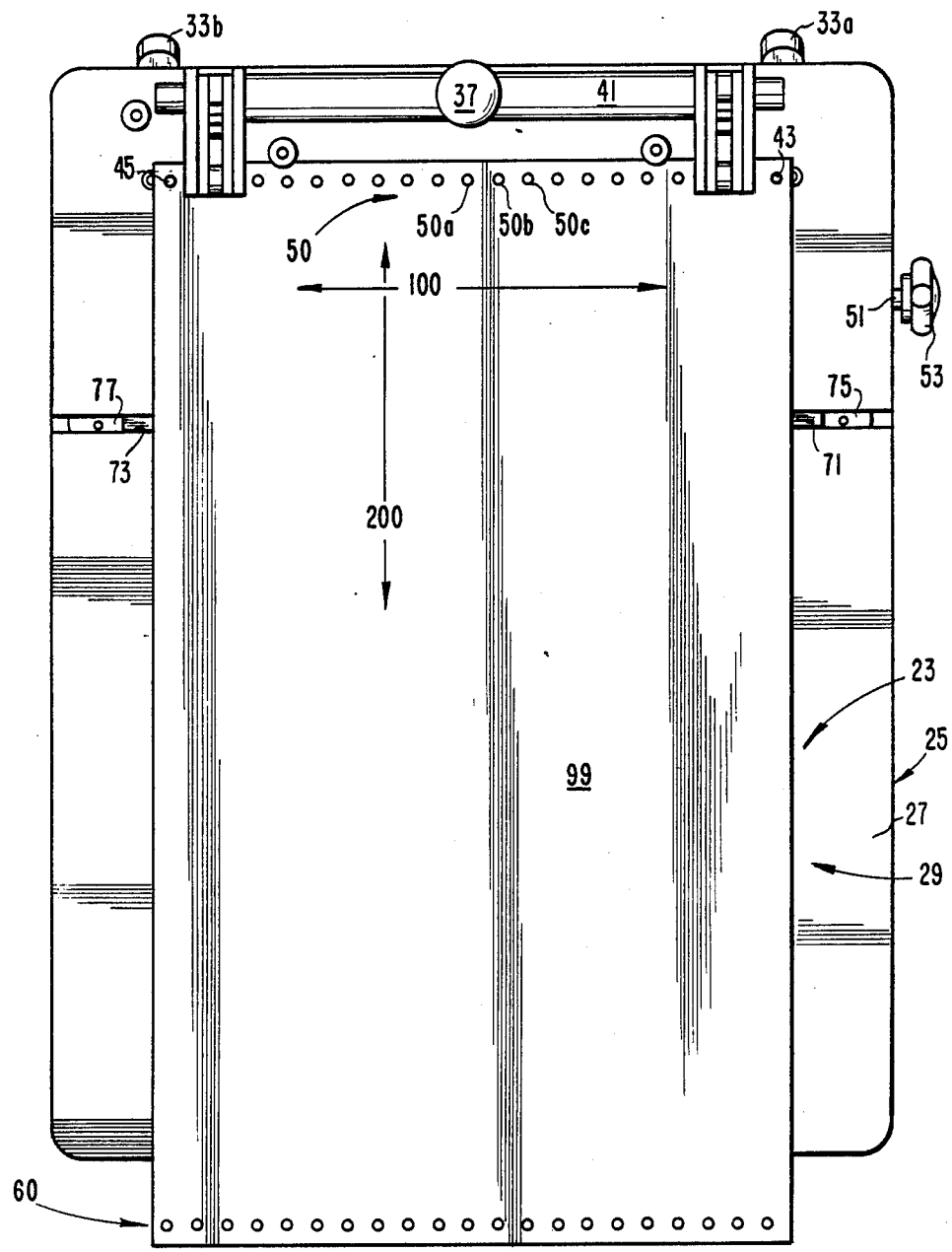
FIG. 1b is a top plan view of the present invention with a printing plate located thereon.
Figure 10:
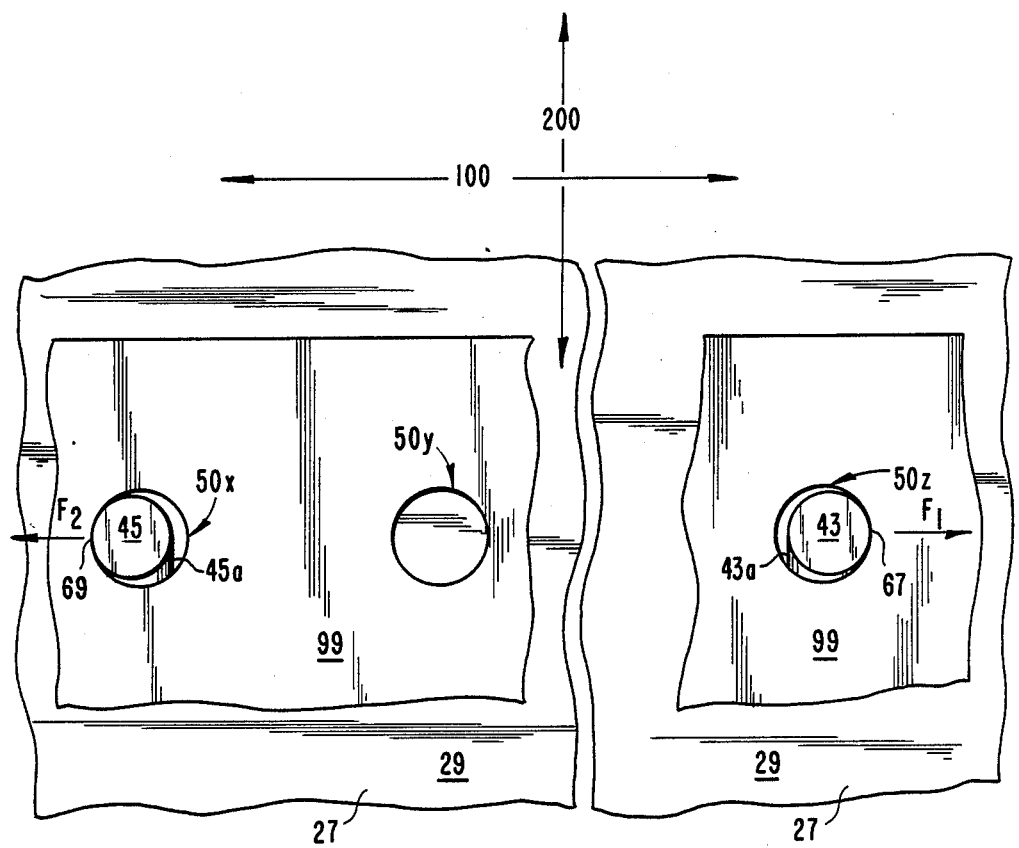
FIG. 10 is a partial top plan view detail of a first pin member and a second pin member of the present invention in the registering holes of a printing plate.

Printing plate 99 is well-known in the art, ordinarily being metallic and having a row of holes 50 laterally spaced apart. Referring to FIG. 1b, printing plate 99 is shown located on working surface 29 on top of covering 27. Row of holes 50 comprises a plurality of holes, such as hole 50a, hole 50b, and hole 50c for example, in alignment along a lateral direction 100 along the front lateral edge of printing plate 99. Similarly, there is a row of holes 60 laterally disposed along the opposite lateral edge of printing plate 99. In the industry, holes such as holes 50a and 50b are spaced apart on one half inch centers. Nominally, the diameter of these holes is 0.160 inches. However, as stated above, the actual diameter of these holes may range as much as between 0.150 inches and 0.171 inches, particularly among different manufacturer's printing plates. As shown in FIG. 1b and FIG. 10, pin member 43 is inserted in hole 50z and pin member 45 is inserted in hole 50x. As illustrated in FIG. 10, pin members 43 and 45 are smaller in size than their respective holes 50z and 50x. Furthermore, pin members 43 and 45 are spring-biased away from each other so that pin member 43 is urged in a lateral direction 100 away from pin member 45. Such spring bias is provided by the respective longitudinal segments 43a and 45a corresponding with the pin members. Alternatively, spring bias may be provided in only one pin member such as 43 while the other pin member such as 45 is fixed.

The result of pin member 43 being biased away from pin member 45, and vice versa, is to impart a lateral tension in printing plate 99 along row of holes 50. Thus, pin member 43 nests with its laterally outer surface against a laterally outermost first tangent point of hole 50z at tangent point 67. Correspondingly, the laterally outer surface of pin member 45 tangentially nests against the laterally outermost second tangent point 69 of hole 50x. The result is to precisely locate printing plate 99 with respect to working surface 29, both in terms of lateral direction 100 and in terms of longitudinal direction 200. Specifically, along lateral direction 100, the tension imparted by pin members 43 and 45 hold printing plate 99 in tension at a fixed location therebetween. In a longitudinal direction 200, by virtue of the tangential nesting action at tangent point 67 and at tangent point 69, the longitudinal position of printing plate 99 is fixed with respect to working surface 29. This longitudinal fixation occurs because, as illustrated in FIG. 10 and in FIG. 8, opposite lateral forces, force $F_1$ and force $F_2$ are equal and opposite to one another. Due to the tangential nesting of the pin members, there is no component force in a longitudinal direction 200 when printing plate 99 reaches an equilibrium position with respect to the pin members. Accordingly, printing plate 99 is positioned in a precisely predetermined location on easel body 23. Thereafter, punching of a pair of quarter inch holes by punch 35 may be accomplished to provide registering holes to register a masking flat with respect to printing plate 99.

Figure 9:
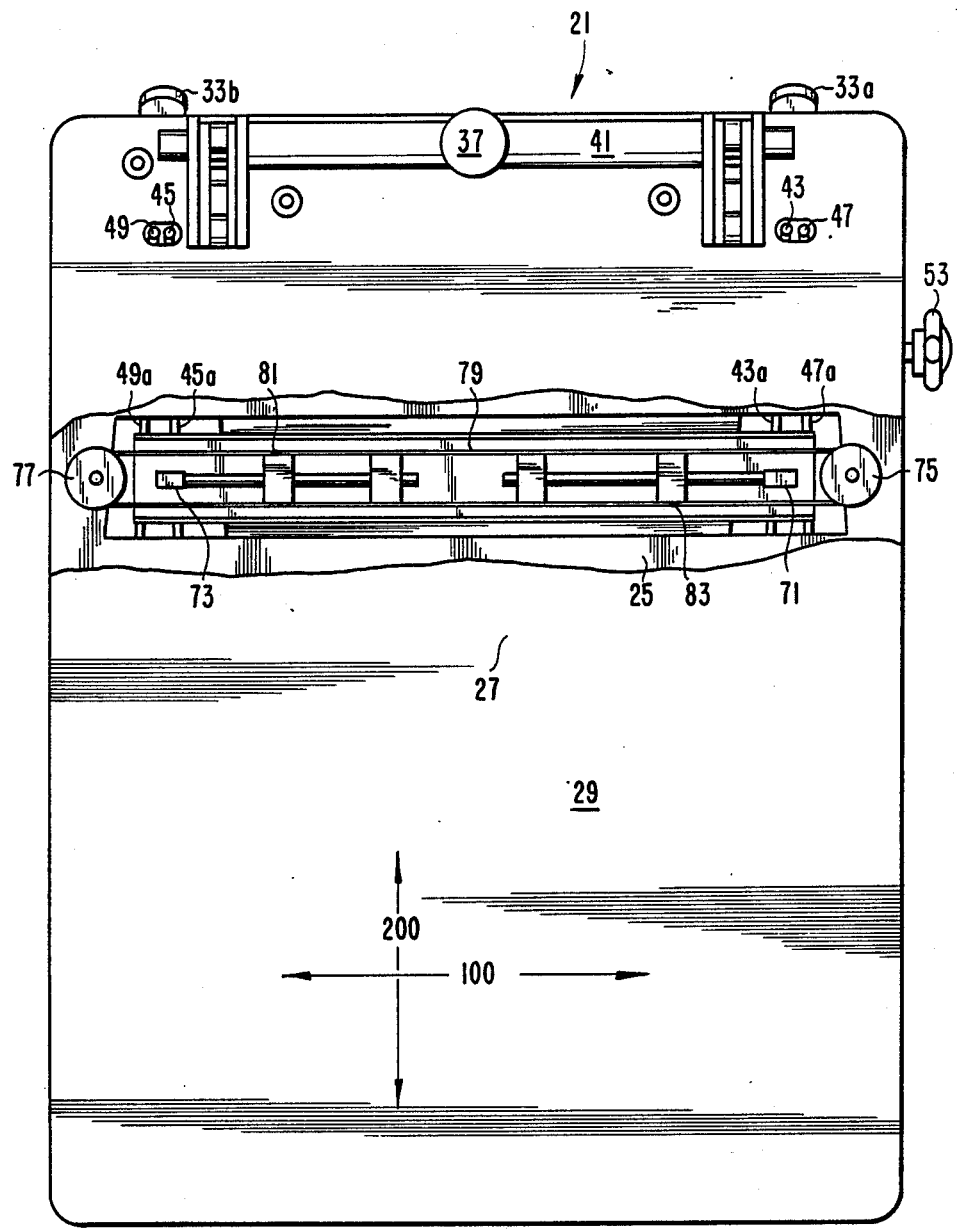
FIG. 9 is a partially cutaway top plan view of the device of the present invention.

Caliper 71 and caliper 73 are provided to assist in centering masking flats 97 having different widths in a lateral direction 100 with respect to easel body 23. Calipers 71 and 73 project above working surface 29 and reciprocate inwardly and outwardly together from a common longitudinal center of easel body 23. As illustrated in FIG. 9, the mechanism for affecting such reciprocating action is shown with covering 27 partially cutaway. Pulley wheel 75 and pulley wheel 77 are pivotable with respect to base 25 and have pulley wire 79 running therebetween. Caliper 73 is attached to pulley wire 79 at attachment 81. On the opposite side of pulley wire 79, caliper 71 is attached thereto at attachment 83. Accordingly, inward or outward movement of one of the calipers causes opposite, equivalent movement inwardly or outwardly of the other caliper. The calipers move in lateral direction 100 in lateral groove 85 (see FIG. 1a) formed in covering 27.

The manner of use of the present invention is as follows. The operator takes working surface 29 and locates thereon printing plate 99. As illustrated, for example in FIGS. 1a and 2, pin member 43 and pin member 45 are extended above working surface 29. The relaxed position of these pin members, their lateral spacing from one another, distance "D" (see FIG. 1a), is greater than the distance between the pre-punched registering holes 50x and 50z (see FIG. 10). With regard to such holes being spaced on one-half inch centers, distance D may be described by the following equation:

$$D = [(N+1) \times \tfrac{1}{2} \text{ inch}] + X$$

Where "N" is an integer corresponding to the number of holes in the row of holes 50 between the pins 43 and 45, and where "X" is the additional lateral deflection distance providing the spring-bias in the pin members. As earlier described, the spring-bias is provided in the present embodiment by longitudinal segment, such as longitudinal segment 43a and longitudinal segment 45a.

Printing plate 99 is mounted over the pin members by first inserting pin member 45 through hole 50x, and thereafter laterally pulling plate 99 in the direction of force $F_1$ until hole 50z is vertically aligned over pin member 43. Pin member 43 is inserted into hole 50z and printing plate 99 is released by the operator. The spring-bias in an outward lateral direction 100 between the pin members provides lateral force $F_1$ and lateral force $F_2$ with respect to the pin members nesting in tangent point 67 and tangent point 69. Thus, printing plate has tension imparted in it along a row of holes 50 between pin member 43 and pin member 45 exerting lateral force $F_1$ against printing plate 99 inside hole 50z and exerting lateral force $F_2$ against printing plate 99 inside hole 50x in an opposite direction to lateral force $F_1$. FIG. 1b illustrates printing plate 99 located on easel body 23 after this step. Next, masking flat 97 is aligned over printing plate 99. As is known in the art, masking flat 97 has the image ultimately to be printed (not shown), such as, for example, a wedding invitation. Masking flat 97 may be aligned utilizing known techniques, and may be aligned utilizing the centering provided by caliper 71 and caliper 73. As illustrated in FIG. 1c, both printing plate 99 and masking flat 97 are located under punch 35 such that punch cutter 44 and punch cutter 46 are located thereover. Next, the operator punches reference holes through masking flat 97 and printing plate 99 by manually actuating handle lever 37 downwardly in direction 39 (see FIG. 2). The result is the punching of two holes through the masking flat and the printing plate. Preferably, such punched holes are 0.250 inches in diameter. The present invention may be practiced utilizing more than two holes, or even conceivably using one hole having an elongated shape.

If the operator discovers upon locating plate 99 upon working surface 29 that the printing plate is not properly centered, the operator may selectively rotate shaft 51 by turning knob 53, causing cam grooves 55, 57, 59 and 61 to rotate. Such camming will cause the alternate pair of pins to extend above working surface 29 and cause the previously extending pins to retract below working surface 29. The previously described steps are repeated with the lateral position of plate 99 being shifted with respect to easel body 23 by the distance between the pairs of pins, typically about one quarter inch. Thus, proper centering of printing plate 99 may be achieved. As described above with regard to FIG. 10, the insertion of pin members into the pre-punched registering holes of the printing plate 99 cause tangential nesting in such holes at tangent point 67 and tangent point 69, whereby printing plate 99 is registered in a fixed longitudinal relationship with respect to the two pin members and with respect to easel body 23.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A printing plate registering method comprising the steps of:
   (a) providing a substantially flat working surface;
   (b) locating a drum mountable offset printing plate on said working surface, said printing plate having a row of holes spaced apart laterally along one end of said printing plate;
   (c) inserting a first pin member in a first of said holes;
   (d) inserting a second pin member in a second of said holes;
   (e) imparting tension in said printing plate along said row of holes between said first pin member and said second pin member with said first pin member exerting a first lateral force against said printing plate inside said first hole and with said second pin member exerting a second lateral force against said printing plate inside said second hole in an opposite direction to said first lateral force;
   (f) aligning a masking flat over said printing plate; and
   (g) punching at least one reference hole in said masking flat and in said printing plate.

2. The method of claim 1 wherein said first hole and said second hole in said printing plate are round, wherein said first pin member has a first laterally outer surface, wherein said second pin member has a second laterally outer surface, and wherein said imparting step includes the step of tangentially nesting said first outer surface against a laterally outermost first tangent point of said first hole and of tangentially nesting said second outer surface against a laterally outermost second tangent point of said second hole, whereby said printing plate is registered in a fixed longitudinal relationship with respect to said first pin member and said second pin member.

3. The method of claim 2 and including a third pin member paired with and laterally spaced from said first pin member, said third pin member extendable above said working surface, said third pin member sized smaller than the first hole and insertable therein, and further including a fourth pin member paired with and laterally spaced from said second pin member, said fourth pin member extendable above said working surface, said fourth pin member sized smaller than the second hole and insertable therein, and further comprising the step of:

(h) selectively rotating a shaft including cam means between a first shaft position and a second shaft position for selectively extending and retracting said pin members, said first shaft position having said first pin member and said second pin member extending above said working surface and spaced apart a first lateral distance, said first shaft position further having said third pin member and said fourth pin member retracted below said working surface, and said second shaft position having said third pin member and said fourth pin member extending above said working surface and spaced apart a second lateral distance greater than said first lateral distance, said second shaft position further having said first pin member and said second pin member retracted below said working surface.

4. The method of claim 3 wherein said aligning step includes the step of laterally centering said masking flat over said printing plate between two laterally slidable caliper arms projecting above said working surface.

5. The method of claim 4 wherein said punching step includes pulling a hand operated lever coupled to two punch cutters reciprocal in a direction normal to said working surface, and wherein said first pin member comprises a metal rod having a longitudinal first segment generally parallel to said working surface and further having a second segment connected to said first segment and generally normal to said working surface, said first segment having a fixed end with respect to said working surface, wherein said shaft is transversely positioned with respect to said first segment in a lateral direction and is located between said first segment and said working surface, said cam means comprising a circumferential groove in said shaft in alignment with said first segment.

6. The method of claim 1 and including a third pin member paired with and laterally spaced from said first pin member, said third pin member extendable above said working surface, said third pin member sized smaller than the first hole and insertable therein, and further including a fourth pin member paired with and laterally spaced from said second pin member, said fourth pin member extendable above said working surface, said fourth pin member sized smaller than the second hole and insertable therein, and further comprising the step of:

(h) selectively rotating a shaft including cam means between a first shaft position and a second shaft position for selectively extending and retracting said pin members, said first shaft position having said first pin member and said second pin member extending above said working surface and spaced apart a first lateral distance, said first shaft position further having said third pin member and said fourth pin member retracted below said working surface, and said second shaft position having said third pin member and said fourth pin member extending above said working surface and spaced apart a second lateral distance greater than said first lateral distance, said second shaft position further having said first pin member and said second pin member retracted below said working surface.

7. The method of claim 1 wherein said aligning step includes the step of laterally centering said masking flat over said printing plate between two laterally slidable caliper arms projecting above said working surface.

8. The method of claim 1 wherein said punching step includes pulling a hand operated lever coupled to two punch cutters reciprocal in a direction normal to said working surface.

9. The method of claim 1 wherein said first pin member comprises a metal rod having a longitudinal first segment generally parallel to said working surface and further having a second segment connected to said first segment and generally normal to said working surface, said first segment having a fixed end with respect to said working surface.

10. A device for registering drum mountable offset printing plates which have a row of registering holes laterally spaced apart along one end and arranged to register with a pin mount on the drum of an offset printing press, the row of holes including a first hole and a second hole spaced laterally apart, comprising:

(a) an easel body having a substantially flat working surface on a top side of said easel body;

(b) a first pin member attached to said easel body and extendable above said working surface, said first pin member sized smaller than the first hole and insertable therein;

(c) a second pin member attached to said easel body and extendable above said working surface, said second pin member sized smaller than the second hole and insertable therein;

(d) spring means associated with said second pin member for urging said second pin member laterally away from said first pin member, said second pin member having a relaxed mode and a biased mode, said biased mode occurring with said spring means imparting tension in the printing plate along the row of holes between said first pin member and said second pin member with said first pin member exerting a first lateral force against the printing plate inside the first hole and with said second pin member exerting a second lateral force against the printing plate inside the second hole in an opposite direction to said first lateral force; and (e) punching means attached to said easel body for punching at least one reference hole in the printing plate and in a masking flat.

11. The device of claim 10 wherein the first hole and the second hole in the printing plate are round, wherein said first pin member has a first laterally outer surface, wherein said second pin member has a second laterally outer surface, and wherein said spring means tangentially nests said first outer surface against a laterally outermost first tangent point of the first hole and tangentially nests said second outer surface against a laterally outermost second tangent point of the second hole, whereby said printing plate is registered in a fixed longitudinal relationship with respect to said first pin member and said second pin member.

12. The device of claim 11 wherein said first pin member comprises a metal rod having a longitudinal first segment generally parallel to said working surface and further having a second segment connected to said first segment and generally normal to said working surface, said first segment being attached to said easel body.

13. The device of claim 12 wherein said second pin member comprises a metal rod having a longitudinal third segment generally parallel to said working surface and further having a fourth segment connected to said third segment and generally normal to said working surface, said third segment being attached to said easel body.

14. The device of claim 13 and further comprising:
   (f) a third pin member paired with and laterally spaced from said first pin member, said third pin member attached to said easel body and extendable above said working surface, said third pin member sized smaller than the first hole and insertable therein;
   (g) a fourth pin member paired with and laterally spaced from said second pin member, said fourth pin member attached to said easel body and extendable above said working surface, said fourth pin member sized smaller than the second hole and insertable therein; and
   (h) a shaft including cam means for selectively extending and retracting said pin members, wherein said shaft has a first shaft position having said first pin member and said second pin member extending above said working surface and spaced apart a first lateral distance, said first shaft position further having said third pin member and said fourth pin member retracted below said working surface, and wherein said shaft has a second shaft position having said third pin member and said fourth pin member extending above said working surface and spaced apart a second lateral distance greater than said first lateral distance, said second shaft position further having said first pin member and said second pin member retracted below said working surface.

15. The device of claim 14 wherein said punching means includes a hand operable lever coupled to two punch cutters reciprocal in a direction normal to said working surface, wherein said shaft is transversely positioned with respect to said first segment in a lateral direction and is located between said first segment and said working surface, said cam means comprising a circumferential groove in said shaft in alignment with said first segment.

16. The device of claim 15 and further comprising:
   (i) means for laterally centering said masking flat over said printing plate between two laterally slidable caliper arms projecting above said working surface.

17. The device of claim 10 wherein said first pin member comprises a metal rod having a longitudinal first segment generally parallel to said working surface and further having a second segment connected to said first segment and generally normal to said working surface, said first segment being attached to said easel body.

18. The device of claim 10 and further comprising:
   (f) a third pin member paired with and laterally spaced from said first pin member, said third pin member attached to said easel body and extendable above said working surface, said third pin member sized smaller than the first hole and insertable therein;
   (g) a fourth pin member paired with and laterally spaced from said second pin member, said fourth pin member attached to said easel body and extendable above said working surface, said fourth pin member sized smaller than the second hole and insertable therein; and
   (h) a shaft including cam means for selectively extending and retracting said pin members, wherein said shaft has a first shaft position having said first pin member and said second pin member extending above said working surface and spaced apart a first lateral distance, said first shaft position further having said third pin member and said fourth pin member retracted below said working surface, and wherein said shaft has a second shaft position having said third pin member and said fourth pin member extending above said working surface and spaced apart a second lateral distance greater than said first lateral distance, said second shaft position further having said first pin member and said second pin member retracted below said working surface.

19. The device of claim 10 wherein said punching means includes a hand operable lever coupled to two punch cutters reciprocal in a direction normal to said working surface.

20. The device of claim 10 and further comprising:
   (f) means for laterally centering said masking flat over said printing plate between two laterally slidable caliper arms projecting above said working surface.

21. A device for registering drum mountable offset printing plates which have a row of registering holes laterally spaced apart along one end and arranged to register with a pin mount on the drum of an offset printing press, the row of holes including a first hole and a second hole spaced laterally apart, comprising:
   (a) an easel body having a substantially flat working surface on a top side of said easel body;
   (b) a first pin member attached to said easel body and extendable above said working surface, said first pin member sized smaller than the first hole and insertable therein;
   (c) a second pin member attached to said easel body and extendable above said working surface, said second pin member sized smaller than the second hole and insertable therein;
   (d) a third pin member paired with and laterally spaced from said first pin member, said third pin member attached to said easel body and extendable above said working surface, said third pin member sized smaller than the first hole and insertable therein;
   (e) a fourth pin member paired with and laterally spaced from said second pin member, said fourth pin member attached to said easel body and extendable above said working surface, said fourth pin member sized smaller than the second hole and insertable therein;
   (f) cam means attached to said easel body for selectively extending and retracting pairs of said pin members for selectively locating the printing plate between a first lateral plate position and a second lateral plate position said working surface, wherein said cam mean has a first cam position having said first pin member and said second pin member extending above said working surface and spaced apart a first lateral distance, said first cam position further having said third pin member and said fourth pin member retracted below said working surface, and wherein said cam means has a second cam position having said third pin member and said fourth pin member extending above said working surface and spaced apart a second lateral distance greater than said first lateral distance, said second cam position further having said first pin member and said second pin member retracted below said working surface; and (g) punching means attached to said easel body for punching at least one reference hole in the printing plate and in a masking flat.

22. The device of claim 21 wherein said first pin member is laterally spaced from said third pin member by about one quarter of an inch, and wherein said second pin member is laterally spaced from said fourth pin member by about one quarter of an inch.

* * * * *